US012614580B2

(12) United States Patent
You et al.

(10) Patent No.: US 12,614,580 B2
(45) Date of Patent: Apr. 28, 2026

(54) SEMICONDUCTOR DEVICES INCLUDING A CLOCK DIVIDER RELATED TO THE GENERATION OF A COMMAND

(71) Applicant: SK hynix Inc., Icheon-si (KR)

(72) Inventors: Jung Taek You, Icheon-si (KR); Han Byeol Kwon, Icheon-si (KR); Kyu Young Kim, Icheon-si (KR)

(73) Assignee: SK hynix Inc., Icheon-si (KR)

( * ) Notice: Subject to any disclaimer, the term of this patent is extended or adjusted under 35 U.S.C. 154(b) by 111 days.

(21) Appl. No.: 18/610,896

(22) Filed: Mar. 20, 2024

(65) Prior Publication Data

US 2025/0157522 A1     May 15, 2025

(30) Foreign Application Priority Data

Nov. 13, 2023    (KR) ......................... 10-2023-0156638

(51) Int. Cl.
| | |
|---|---|
| *G11C 7/22* | (2006.01) |
| *G11C 11/4076* | (2006.01) |
| *G11C 11/408* | (2006.01) |
| *G11C 11/4096* | (2006.01) |

(52) U.S. Cl.
CPC ...... *G11C 11/4076* (2013.01); *G11C 11/4087* (2013.01); *G11C 11/4096* (2013.01)

(58) Field of Classification Search
CPC ........... G11C 11/4076; G11C 11/4087; G11C 11/4096; G11C 7/222; G11C 8/06; G11C 8/10; G06F 3/0659
See application file for complete search history.

(56) References Cited

U.S. PATENT DOCUMENTS

| | | | |
|---|---|---|---|
| 2007/0058460 A1 | 3/2007 | Stave | |
| 2018/0102150 A1* | 4/2018 | Choi ..................... | G11C 29/028 |
| 2018/0330775 A1* | 11/2018 | Lee ........................ | G11C 7/106 |
| 2019/0096469 A1* | 3/2019 | Kondo ............... | G11C 11/4093 |
| 2019/0198073 A1* | 6/2019 | Kim ........................ | G11C 7/222 |
| 2020/0379680 A1* | 12/2020 | Kim ..................... | G06F 3/0679 |
| 2022/0069825 A1* | 3/2022 | Kim ........................ | H03K 21/10 |
| 2023/0386553 A1* | 11/2023 | Huang ................. | G11C 7/1063 |
| 2025/0149077 A1* | 5/2025 | Yoon .................. | H03K 19/1737 |

FOREIGN PATENT DOCUMENTS

KR        1020180038343 A      4/2018

* cited by examiner

*Primary Examiner* — Mushfique Siddique
(74) *Attorney, Agent, or Firm* — WILLIAM PARK AND ASSOCIATES LTD.

(57)        ABSTRACT

A semiconductor device includes a clock division circuit configured to generate division clocks from a clock signal, based on a division enable signal that is activated based on a chip selection signal, and a valid time determination circuit configured to generate a valid signal for setting a generation time of a command, based on the chip selection signal and the division clocks.

16 Claims, 7 Drawing Sheets

Figure 4:
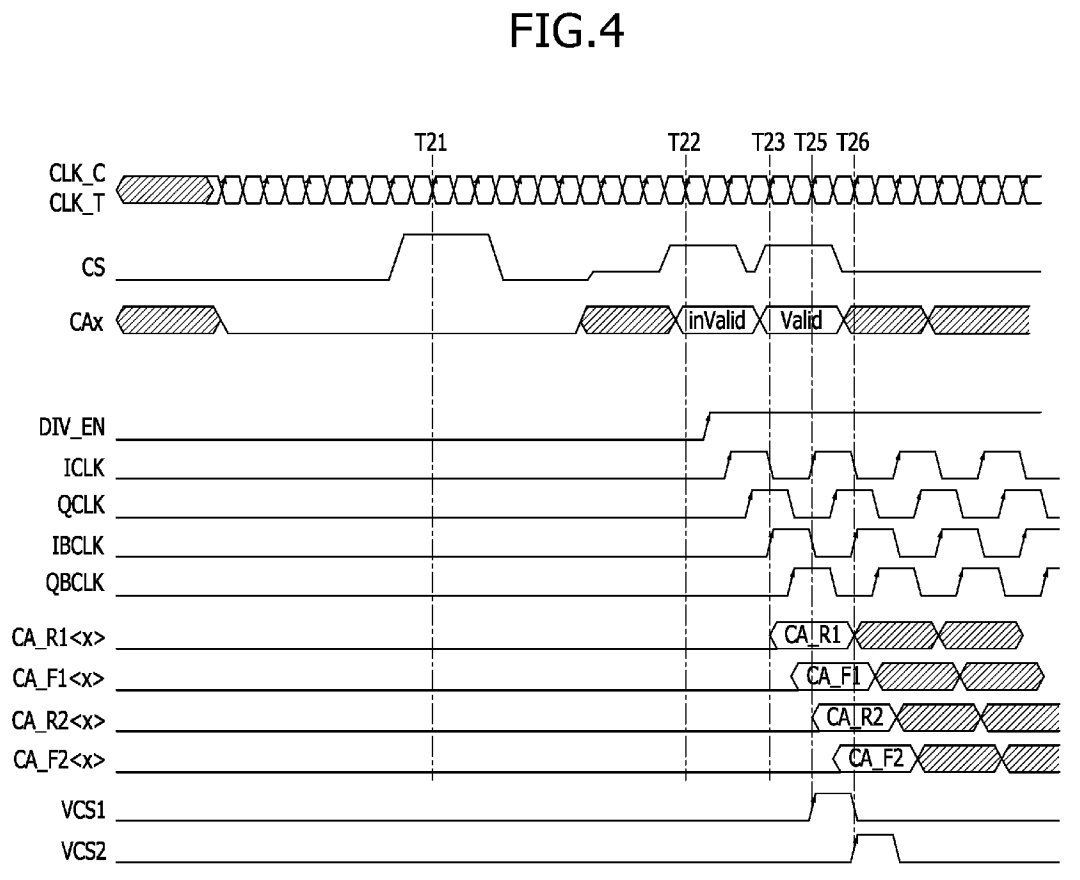

CLK_C
CLK_T

CS

CAx          inValid   Valid

DIV_EN

ICLK

QCLK

IBCLK

QBCLK

CA_R1<x>     CA_R1

CA_F1<x>     CA_F1

CA_R2<x>     CA_R2

CA_F2<x>     CA_F2

VCS1

VCS2

SEMICONDUCTOR DEVICES INCLUDING A CLOCK DIVIDER RELATED TO THE GENERATION OF A COMMAND

CROSS-REFERENCE TO RELATED APPLICATIONS

The present application claims priority under 35 U.S.C. 119(a) to Korean Patent Application No. 10-2023-0156638, filed on Nov. 13, 2023, in the Korean Intellectual Property Office, which is incorporated herein by reference in its entirety.

BACKGROUND

1. Technical Field

Embodiments of the present disclosure generally relate to a semiconductor device, and more particularly, to a semiconductor device related to the generation of a command.

2. Related Art

As the scaling of semiconductor devices progresses, high efficiency of pads connected to the semiconductor devices is required. The semiconductor devices receive command addresses through the pads and generate internal commands and internal addresses to perform internal operations. Therefore, it is necessary to minimize the number of pads used in the semiconductor devices to scale-down the semiconductor devices.

Meanwhile, because the semiconductor devices use high-frequency external clocks for high-speed operation, the semiconductor devices control the internal operations using division clocks generated by dividing the external clocks for stable internal operation.

SUMMARY

In accordance with an embodiment of the present disclosure, a semiconductor device may include a clock division circuit configured to receive a division enable signal to generate division clocks from a clock signal, when the division enable signal is activated based on a chip selection signal, and a valid time determination circuit configured to generate a valid signal for setting a generation time of a command, based on the chip selection signal and the division clocks.

In addition, in accordance with an embodiment of the present disclosure, a semiconductor device may include a division enable signal generation circuit configured to generate a division enable signal that is activated when a chip selection signal set to have a preset logic level is received in synchronization with a clock signal after exiting from a power-down section, and a valid time determination circuit configured to generate a valid signal for setting a generation time of a command, based on division clocks generated based on the division enable signal and the chip selection signal.

In addition, in accordance with an embodiment of the present disclosure, a semiconductor device may include a clock division circuit configured to receive a division enable signal to generate division clocks from a clock signal, when the division enable signal is activated based on a chip selection signal, and a valid time determination circuit configured to generate a first valid signal and a second valid signal for setting a generation time of a command, based on the chip selection signal and the division clocks.

BRIEF DESCRIPTION OF THE DRAWINGS

FIG. 2 is a timing diagram illustrating a command generation operation of the semiconductor device shown in FIG. 1.

FIG. 4 is a timing diagram illustrating a command generation operation of the semiconductor device shown in FIG. 3.

FIG. 5 is a block diagram illustrating a configuration of a semiconductor system according to an embodiment of the present disclosure.

DETAILED DESCRIPTION

Figure 1:
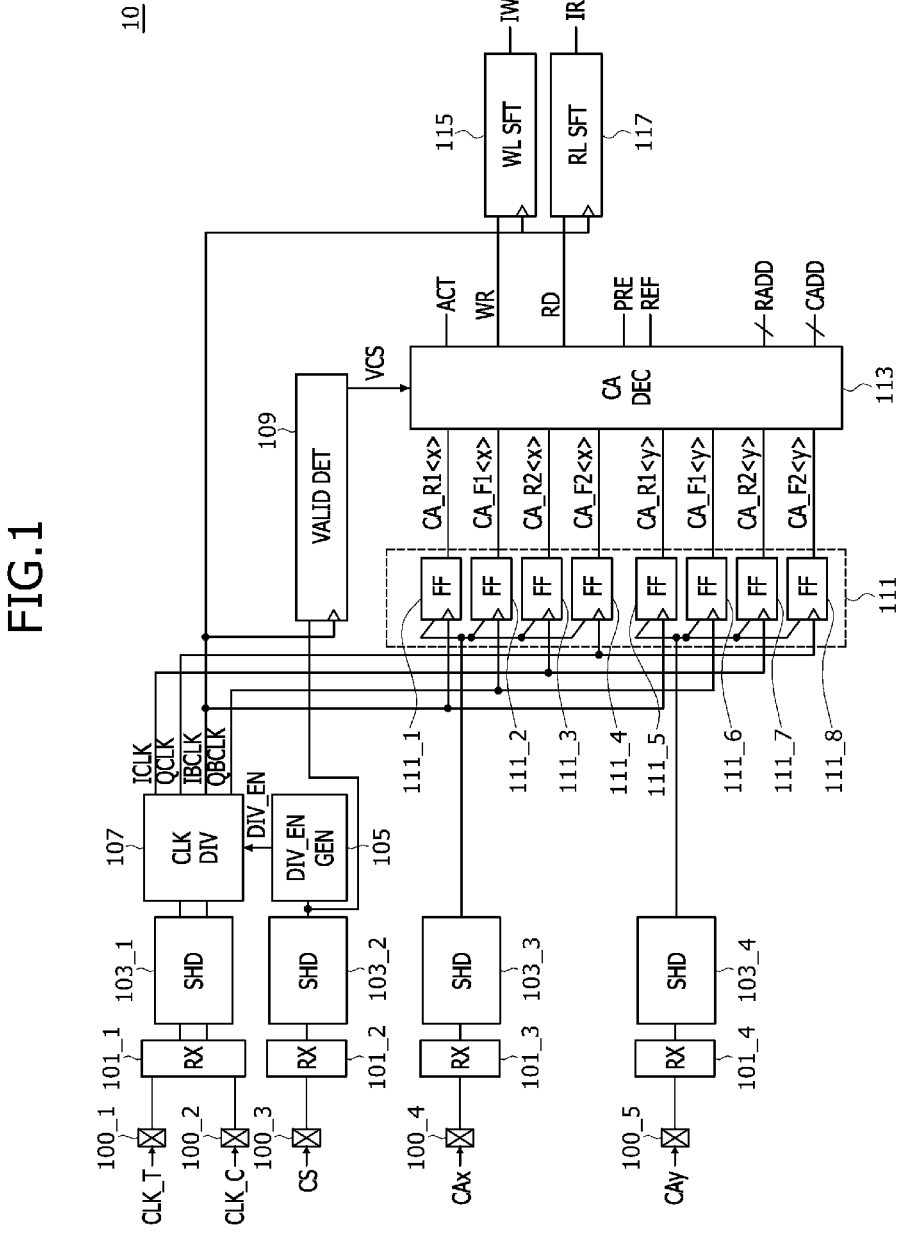
FIG. 1 is a block diagram illustrating a configuration of a semiconductor device according to an embodiment of the present disclosure.

In the following description of embodiments, when a parameter is referred to as being "predetermined," it may be intended to mean that a value of the parameter is determined in advance when the parameter is used in a process or an algorithm. The value of the parameter may be set when the process or the algorithm starts or may be set during a period in which the process or the algorithm is executed. In the following description of embodiments, when a parameter is referred to as being "preset," it may be intended to mean that a value of the parameter is determined in advance when the parameter is used in a process or an algorithm. The value of the parameter may be set when the process or the algorithm starts or may be set during a period in which the process or the algorithm is executed. For example, the word "preset" as used herein with respect to a parameter, such as a preset logic level, delay section, or state, means that a value for the parameter is determined prior to the parameter being used in a process or algorithm. For some embodiments, the value for the parameter is determined before the process or algorithm begins. In other embodiments, the value for the parameter is determined during the process or algorithm but before the parameter is used in the process or algorithm.

It will be understood that although the terms "first," "second," "third," etc. are used herein to describe various elements, these elements should not be limited by these terms. These terms are only used to distinguish one element from another element and are not intended to imply an order or number of elements. Thus, a first element in some embodiments could be termed a second element in other embodiments without departing from the teachings of the present disclosure.

Further, it will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

A logic "high" level and a logic "low" level may be used to describe logic levels of electric signals. A signal having a logic "high" level may be distinguished from a signal having a logic "low" level. For example, when a signal having a first voltage corresponds to a signal having a logic "high" level, a signal having a second voltage corresponds to a signal having a logic "low" level. In an embodiment, the logic "high" level may be set as a voltage level which is higher than a voltage level of the logic "low" level. Meanwhile, logic levels of signals may be set to be different or opposite according to the embodiments. For example, a certain signal having a logic "high" level in one embodiment may be set to have a logic "low" level in another embodiment.

The term "logic bit set" may mean a combination of logic levels of bits included in a signal. When the logic level of each of the bits included in the signal is changed, the logic bit set of the signal may be set differently. For example, when the signal includes two bits, when the logic level of each of the two bits included in the signal is "logic low level, logic low level", the logic bit set of the signal may be set as the first logic bit set, and when the logic level of each of the two bits included in the signal is "a logic low level and a logic high level", the logic bit set of the signal may be set as the second logic bit set.

Various embodiments of the present disclosure will be described hereinafter in more detail with reference to the accompanying drawings. However, the embodiments described herein are for illustrative purposes only and are not intended to limit the scope of the present disclosure.

FIG. 1 is a block diagram illustrating a configuration of a semiconductor device 10 according to an embodiment of the present disclosure. As shown in FIG. 1, the semiconductor device 10 may include pads 1001, 100_2, 1003, 100_4, and 1005, receivers (RXs) 101_1, 1012, 1013, and 101_4, setup hold delay units (SHDs) 103_1, 103_2, 1033, and 1034, a division enable signal generation circuit (DIV_EN GEN) 105, a clock division circuit (CLK DIV) 107, a valid time determination circuit (VALID DET) 109, a command address latch circuit 111, a command address decoder (CA DEC) 113, a latency shifting circuit (i.e., a write latency shifting circuit (WL SFT) 115 and or a read latency shifting circuit (RL SFT) 117).

The receiver 101_1 may receive clocks CLK_T and CLK_C through the pads 100_1 and 100_2. The clocks CLK_T and CLK_C may be applied from a controller (e.g., 31 in FIG. 5). The clock CLK_T and the clock CLK_C may be set to have opposite phases to each other, but this is only an example and the present disclosure is not limited thereto. The setup hold delay unit 1031 may delay the clocks CLK_T and CLK_C received through the receiver 101_1 to control the setup time and hold time of each of the clocks CLK_T and CLK_C. The delay section in which the clocks CLK_T and CLK_C are delayed in the setup hold delay unit 103_1 may be set in various ways depending on the embodiments.

The receiver 101_2 may receive a chip selection signal CS through the pad 100_3. The chip selection signal CS may be applied from the controller (e.g., 31 in FIG. 5), and may be used to determine whether to exit from a power-down mode and generate a valid command. The setup hold delay unit 103_2 may delay the chip selection signal CS received through the receiver 101_2 to control the setup time and hold time of the chip selection signal CS. The delay section in which the chip selection signal CS is delayed in the setup hold delay unit 103_2 may be set in various ways depending on the embodiments.

The receiver 101_3 may receive a first command address CAx through the pad 100_4. The first command address CAx may be applied from the controller (e.g., 31 in FIG. 5), and may include commands and addresses for internal operations. The setup hold delay unit 1033 may delay the first command address CAx received through the receiver 101_3 to control the setup time and hold time of the first command address CAx. The delay section in which the first command address CAx is delayed in the setup hold delay unit 103_3 may be set in various ways depending on the embodiments.

The receiver 1014 may receive a second command address CAy through the pad 100_5. The second command address CAy may be applied from the controller (e.g., 31 in FIG. 5), and may include commands and addresses for the internal operations. The setup hold delay unit 103_4 may delay the second command address CAy received through the receiver 101_4 to control the setup time and hold time of the second command address CAy. The delay section in which the second command address CAy is delayed in the setup hold delay unit 103_4 may be set in various ways depending on the embodiments. The second command address CAy may be applied at different time from the first command address CAx, but may be implemented to be applied at the same time as the first command address CAx depending on the embodiments.

The division enable signal generation circuit 105 may be electrically connected to the setup hold delay unit 103_2 to receive the chip selection signal CS from the setup hold delay unit 103_2. The division enable signal generation circuit 105 may generate a division enable signal DIV_EN, based on the chip selection signal CS. The division enable signal generation circuit 105 may generate the division enable signal DIV_EN that is activated when the chip selection signal CS is received in a preset state after exiting from a power-down section. As an example, the division enable signal generation circuit 105 may generate the division enable signal DIV_EN that is activated when the chip selection signal CS set to have a logic "high" level is received after exiting from the power-down section.

The clock division circuit 107 may be electrically connected to the setup hold delay unit 103_1 and the division enable signal generation circuit 105 to receive the clocks CLK_T and CLK_C from the setup hold delay unit 103_1 and to receive the division enable signal DIV_EN from the division enable signal generation circuit 105. The clock division circuit 107 may generate division clocks ICLK, QCLK, IBCLK, and QBCLK from the division enable signal DIV_EN and the clocks CLK_T and CLK_C. The clock division circuit 107 may divide the clocks CLK_T and CLK_C to generate the division clocks ICLK, QCLK, IBCLK, and QBCLK when the division enable signal DIV_EN is activated. Each of the division clocks ICLK, QCLK, IBCLK, and QBCLK may be set as a two-divided signal of the clocks CLK_T and CLK_C, but this is only an example and the present disclosure is not limited thereto.

The valid time determination circuit 109 may be electrically connected to the setup hold delay unit 103_2 and the clock division circuit 107 to receive the chip selection signal CS from the setup hold delay unit 103_2 and to receive the division clock IBCLK from the clock division circuit 107. The valid time determination circuit 109 may detect a logic level of the chip selection signal CS in synchronization with the division clock IBCLK to generate a valid signal VCS. As an example, the valid time determination circuit 109 may generate the valid signal VCS that is activated at a valid command generation time when the detection condition of receiving the chip selection signal CS set to have a logic "high" level in synchronization with a rising edge (defined as a section transitioning from a logic "low" level to a logic "high" level') of the division clock IBCLK is satisfied. Here, the valid command generation time may be set to the time when the detection condition is satisfied or the time when a preset delay section elapses from the time when the detection condition is satisfied. As another example, the valid time determination circuit 109 may generate the valid signal VCS that is activated at the valid command generation time when the detection condition of receiving the chip selection signal CS set to have a logic "high" level 'N' times or more in synchronization with the rising edge of the division clock IBCLK is satisfied. Here, 'N' may be set to a natural number of 2 or more. As another example, the valid time determination circuit 109 may generate the valid signal VCS that is activated at the valid command generation time when the detection condition of receiving the chip selection signal CS set to have a logic "high" level in synchronization with the rising edge and falling edge (defined as 'a section transitioning from a logic "high" level to a logic "low" level') of the division clock IBCLK is satisfied. Meanwhile, the valid time determination circuit 109 may be implemented to detect the logic level of the chip selection signal CS in synchronization with one of the division clocks ICLK, QCLK, and QBCLK to generate the valid signal VCS, depending on the embodiments.

The command address latch circuit 111 may be electrically connected to the clock division circuit 107, the setup hold delay unit 1033, and the setup hold delay unit 103_4 to receive the division clocks ICLK, QCLK, IBCLK, and QBCLK from the clock division circuit 107, to receive the first command address CAx from the setup hold delay unit 1033, and to receive the second command address CAy from the setup hold delay unit 103_4. The command address latch circuit 111 may latch the first command address CAx and the second command address CAy in synchronization with the division clocks ICLK, QCLK, IBCLK, and QBCLK to generate first latch command addresses CA_R1<x>, CA_F1<x>, CA_R2<x>, and CA_F2<x> and second latch command addresses CA_R1<y>, CA_F1<y>, CA_R2<y>, and CA_F2<y>. More specifically, the command address latch circuit 111 may latch the first command address CAx and the second command address CAy in synchronization with the division clock IBCLK to generate the first latch command address CA_R1<x> and the second latch command address CA_R1<y>. The command address latch circuit 111 may latch the first command address CAx and the second command address CAy in synchronization with the division clock QBCLK to generate the first latch command address CA_F1<x> and the second latch command address CA_F1<y>. The command address latch circuit 111 may latch the first command address CAx and the second command address CAy in synchronization with the division clock ICLK to generate the first latch command address CA_R2<x> and the second latch command address CA_R2<y>. The command address latch circuit 111 may latch the first command address CAx and the second command address CAy in synchronization with the division clock QCLK to generate the first latch command address CA_F2<x> and the second latch command address CA_F2<y>. In an embodiment, the command address latch circuit 111 may include flip flops (FF) 111_1 to 111_8 coupled to the semiconductor device 10 as shown, for example, in FIG. 1.

The command address decoder 113 may be electrically connected to the valid time determination circuit 109 and the command address latch circuit 111 to receive the valid signal VCS from the valid time determination circuit 109 and to receive the first latch command addresses CA_R1<x>, CA_F1<x>, CA_R2<x>, and CA_F2<x> and the second latch command addresses CA_R1<y>, CA_F1<y>, CA_R2<y>, and CA_F2<y>. The command address decoder 113 may decode the first latch command addresses CA_R1<x>, CA_F1<x>, CA_R2<x>, and CA_F2<x> and the second latch command addresses CA_R1<y>, CA_F1<y>, CA_R2<y>, and CA_F2<y> to generate internal commands ACT, WR, RD, PRE, and REF and internal addresses RADD and CADD when the valid signal VCS is activated at the valid command generation time. The internal commands ACT, WR, RD, PRE, and REF may include the active command ACT generated for an active operation, the write command WR generated for a write operation, the read command RD generated for a read operation, the precharge command PRE generated for a precharge operation, and the refresh command REF generated for a refresh operation. The internal addresses RADD and CADD may include the row address RADD for selecting a word line (not shown) in a row operation and the column address CADD for selecting an input/output switch (not shown) in a column operation.

The write latency shifting circuit 115 may be electrically connected to the clock division circuit 107 and the command address decoder 113 to receive the division clock IBCLK from the clock division circuit 107 and to receive the write command WR from the command address decoder 113. The write latency shifting circuit 115 may shift the write command WR, based on the division clock IBCLK to generate a shifting command (i.e., shifting write command IWR). The write latency shifting circuit 115 may be implemented to shift the write command WR, based on one of the division clocks ICLK, QCLK, and QBCLK depending on the embodiments.

The read latency shifting circuit 117 may be electrically connected to the clock division circuit 107 and the command address decoder 113 to receive the division clock IBCLK from the clock division circuit 107 and to receive the read command RD from the command address decoder 113. The read latency shifting circuit 117 may shift the read command RD, based on the division clock IBCLK to generate a shifting command (i.e., shifting read command IRD). The read latency shifting circuit 117 may be implemented to shift the read command RD, based on one of the division clocks ICLK, QCLK, and QBCLK depending on the embodiments.

In an embodiment, the semiconductor device 10 configured as described above may set the command generation time according to the chip selection signal CS without using a separate control signal, thereby minimizing the number of control signals required to generate the command and increasing pad use efficiency. In an embodiment, the semiconductor device 10 may latch the command addresses CAx and CAy using the division clock IBCLK and perform the shifting operations necessary for the write and read operations, thereby stably performing the internal operations even when the high-frequency clocks CLK_T and CLK_C are input.

Figure 2:
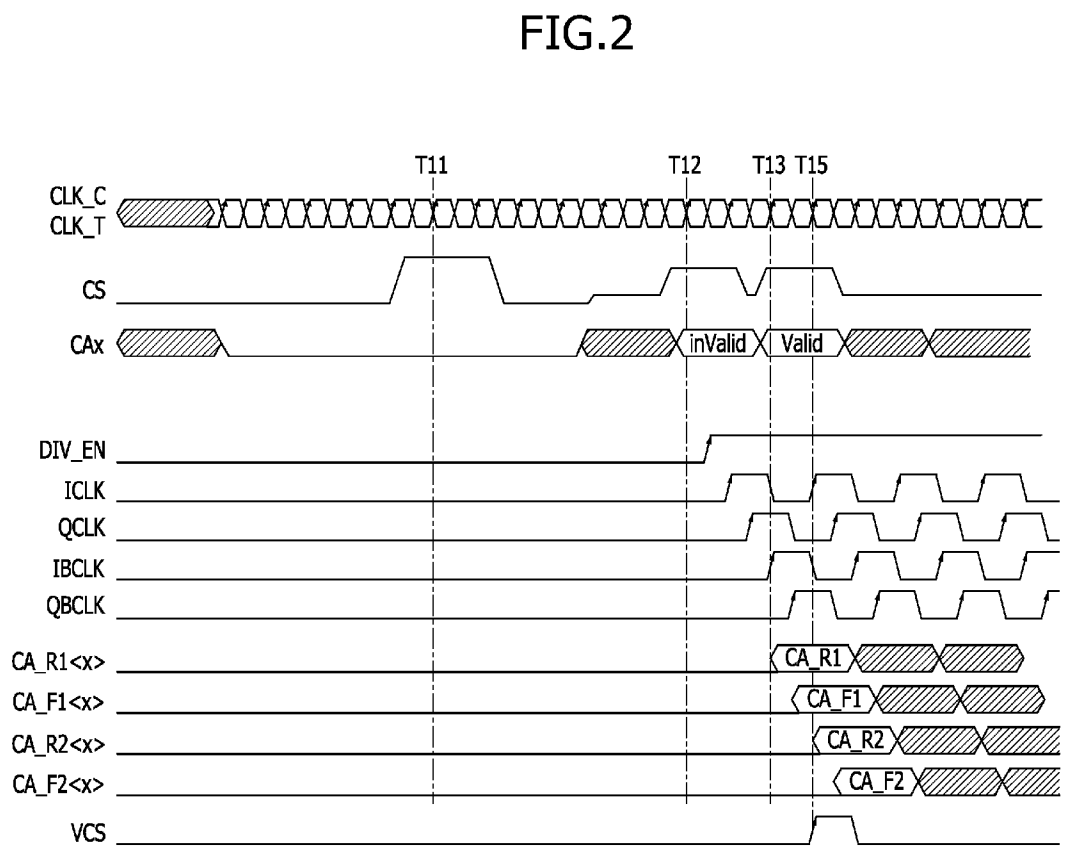

FIG. 2 is a timing diagram illustrating a command generation operation of the semiconductor device 10 shown in FIG. 1. The command generation operation of the semiconductor device 10 will be described in more detail with reference to FIGS. 1 and 2, as follows.

First, at time T11, the semiconductor device 10 in a power-down mode may receive the chip selection signal CS of a logic "high" level in synchronization with a rising edge of the clock CLK_T to exit from the power-down mode. Next, at time T12, the division enable signal generation circuit 105 may receive the chip selection signal CS of a logic "high" level to generate the activated division enable signal DIV_EN after exiting from the power-down mode, and the clock division circuit 107 may generate the division clocks ICLK, QCLK, IBCLK, and QBCLK according to the division enable signal DIV_EN. The voltage level fluctuation range of the chip selection signal CS may be set differently before and after escaping from the power-down mode depending on various causes such as whether termination is performed, but this is only an example and the present disclosure is not limited thereto. Next, after time T13, the command address latch circuit 111 may sequentially latch the first command address CAx in synchronization with the division clocks ICLK, QCLK, IBCLK, and QBCLK to generate the first latch command addresses CA_R1<x>, CA_F1<x>, CA_R2<x>, and CA_F2<x>. Meanwhile, because the detection condition of receiving the chip selection signal CS set to have a logic "high" level in synchronization with the rising edge of the division clock IBCLK is satisfied at time T13, the valid time determination circuit 109 may generate the valid signal VCS that is activated at the valid command generation time, that is, time T15. During the section in which the valid signal VCS is activated after time T15, the command address decoder 113 may decode the first latch command addresses CA_R1<x>, CA_F1<x>, CA_R2<x>, and CA_F2<x> to generate at least one of the internal commands ACT, WR, RD, PRE, and REF and the internal addresses RADD and CADD.

Figure 3:
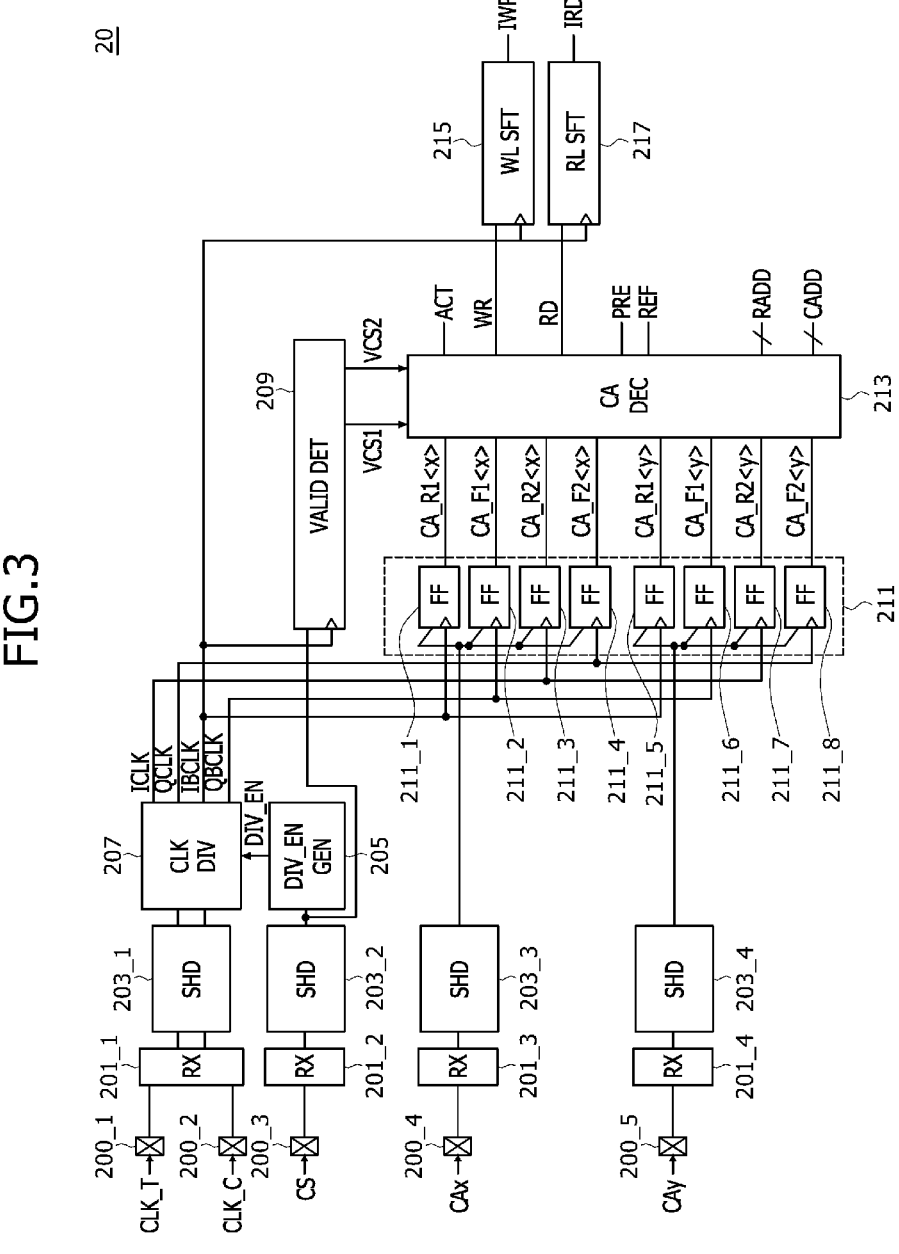
FIG. 3 is a block diagram illustrating a configuration of a semiconductor device according to an embodiment of the present disclosure.

FIG. 3 is a block diagram illustrating a configuration of a semiconductor device 20 according to an embodiment of the present disclosure. As shown in FIG. 3, the semiconductor device 20 may include pads 2001, 2002, 2003, 2004, and 2005, receivers (Rxs) 201_1, 201_2, 201_3, and 2014, setup hold delay units (SHDs) 203_1, 203_2, 2033, and 2034, a division enable signal generation circuit (DIV_EN GEN) 205, a clock division circuit (CLK DIV) 207, a valid time determination circuit (VALID DET) 209, a command address latch circuit 211, a command address decoder (CA DEC) 213, a write latency shifting circuit (WL SFT) 215, and a read latency shifting circuit (RL SFT) 217.

The receiver 201_1 may receive clocks CLK_T and CLK_C through the pads 200_1 and 200_2. The setup hold delay unit 203_1 may delay the clocks CLK_T and CLK_C received through the receiver 201_1 to control the setup time and hold time of each of the clocks CLK_T and CLK_C. The delay section in which the clocks CLK_T and CLK_C are delayed in the setup hold delay unit 203_1 may be set in various ways depending on the embodiments.

The receiver 201_2 may receive a chip selection signal CS through the pad 200_3. The setup hold delay unit 203_2 may delay the chip selection signal CS received through the receiver 201_2 to control the setup time and hold time of the chip selection signal CS. The delay section in which the chip selection signal CS is delayed in the setup hold delay unit 203_2 may be set in various ways depending on the embodiments.

The receiver 201_3 may receive a first command address CAx through the pad 200_4. The setup hold delay unit 2033 may delay the first command address CAx received through the receiver 201_3 to control the setup time and hold time of the first command address CAx. The delay section in which the first command address CAx is delayed in the setup hold delay unit 203_3 may be set in various ways depending on the embodiments.

The receiver 2014 may receive a second command address CAy through the pad 200_5. The setup hold delay unit 203_4 may delay the second command address CAy received through the receiver 201_4 to control the setup time and hold time of the second command address CAy. The delay section in which the second command address CAy is delayed in the setup hold delay unit 203_4 may be set in various ways depending on the embodiments. The second command address CAy may be applied at a different time from the first command address CAx, but may be implemented to be applied at the same time as the first command address CAx depending on the embodiments.

The division enable signal generation circuit 205 may be electrically connected to the setup hold delay unit 203_2 to receive the chip selection signal CS from the setup hold delay unit 203_2. The division enable signal generation circuit 205 may generate a division enable signal DIV_EN, based on the chip selection signal CS. The division enable signal generation circuit 205 may generate the division enable signal DIV_EN that is activated when the chip selection signal CS is received in a preset state after exiting from the power-down section.

The clock division circuit 207 may be electrically connected to the setup hold delay unit 203_1 and the division enable signal generation circuit 205 to receive the clocks CLK_T and CLK_C from the setup hold delay unit 203_1 and to receive the division enable signal DIV_EN from the division enable signal generation circuit 205. The clock division circuit 207 may generate division clocks ICLK, QCLK, IBCLK, and QBCLK from the division enable signal DIV_EN and the clocks CLK_T and CLK_C. The clock division circuit 207 may divide the clocks CLK_T and CLK_C to generate the division clocks ICLK, QCLK, IBCLK, and QBCLK when the division enable signal DIV_EN is activated.

The valid time determination circuit 209 may be electrically connected to the setup hold delay unit 203_2 and the clock division circuit 207 to receive the chip selection signal CS from the setup hold delay unit 203_2 and to receive the division clock IBCLK from the clock division circuit 207. The valid time determination circuit 209 may detect a logic level of the chip selection signal CS in synchronization with the division clock IBCLK to generate a first valid signal VCS1 and a second valid signal VCS2. As an example, the valid time determination circuit 209 may generate the first valid signal VCS1 that is activated at a first valid command generation time and the second valid signal VCS2 that is activated at a second valid command generation time when the detection condition of receiving the chip selection signal CS set to have a logic "high" level in synchronization with a rising edge of the division clock IBCLK is satisfied. Here, the first valid command generation time may be set to the time when the detection conditions are satisfied or when a preset delay section elapses from the time when the detection condition is satisfied, and the second valid command generation time may be set to a time after the first effective command generation time. As another example, the valid time determination circuit 209 may generate the first valid signal VCS1 that is activated at the first valid command generation time and the second valid signal VCS2 that is activated at the second valid command generation time when the detection condition of receiving the chip selection signal CS set to have a logic "high" level in synchronization with the rising edge of the division clock IBCLK 'N' times and more is satisfied. As another example, the valid time determination circuit 209 may generate the first valid signal VCS1 that is activated at the first valid command generation time and the second valid signal VCS2 that is activated at the second valid command generation time when the detection condition of receiving the chip selection signal CS set to have a logic "high" level in synchronization with the rising edge and falling edge of the division clock IBCLK is satisfied. Meanwhile, the valid time determination circuit 209 may be implemented to detect the logic level of the chip selection signal CS in synchronization with one of the division clocks ICLK, QCLK, and QBCLK to generate the first valid signal VCS1 and the second valid signal VCS2, depending on the embodiments.

The command address latch circuit 211 may be electrically connected to the clock division circuit 207, the setup hold delay unit 2033, and the setup hold delay unit 203_4 to receive the division clocks ICLK, QCLK, IBCLK, and QBCLK from the clock division circuit 207, to receive the first command address CAx from the setup hold delay unit 2033, and to receive the second command address CAy from the setup hold delay unit 203_4. The command address latch circuit 211 may latch the first command address CAx and the second command address CAy in synchronization with the division clocks ICLK, QCLK, IBCLK, and QBCLK to generate first latch command addresses CA_R1<x>, CA_F1<x>, CA_R2<x>, and CA_F2<x> and second latch command addresses CA_R1<y>, CA_F1<y>, CA_R2<y>, and CA_F2<y>. More specifically, the command address latch circuit 211 may latch the first command address CAx and the second command address CAy in synchronization with the division clock IBCLK to generate the first latch command address CA_R1<x> and the second latch command address CA_R1<y>. The command address latch circuit 211 may latch the first command address CAx and the second command address CAy in synchronization with the division clock QBCLK to generate the first latch command address CA_F1<x> and the second latch command address CA_F1<y>. The command address latch circuit 211 may latch the first command address CAx and the second command address CAy in synchronization with the division clocks ICLK to generate the first latch command address CA_R2<x> and the second latch command address CA_R2<y>. The command address latch circuit 211 may latch the first command address CAx and the second command address CAy in synchronization with the division clocks QCLK to generate the first latch command address CA_F2<x> and the second latch command address CA_F2<y>.

The command address decoder 213 may be electrically connected to the valid time determination circuit 209 and the command address latch circuit 211 to receive the first valid signal VCS1 and the second valid signal VCS2 from the valid time determination circuit 209 and to receive the first latch command addresses CA_R1<x>, CA_F1<x>, CA_R2<x>, and CA_F2<x> and the second latch command addresses CA_R1<y>, CA_F1<y>, CA_R2<y>, and CA_F2<y> from the command address latch circuit 211. The command address decoder 213 may decode the first latch command addresses CA_R1<x>, CA_F1<x>, CA_R2<x>, and CA_F2<x> and the second latch command addresses CA_R1<y>, CA_F1<y>, CA_R2<y>, and CA_F2<y> to generate internal commands ACT, WR, RD, PRE, and REF and internal addresses RADD and CADD when the first valid signal VCS1 is activated at a first valid command generation time. The command address decoder 213 may decode the first latch command addresses CA_R1<x>, CA_F1<x>, CA_R2<x>, and CA_F2<x> and the second latch command addresses CA_R1<y>, CA_F1<y>, CA_R2<y>, and CA_F2<y> to generate the internal commands ACT, WR, RD, PRE, and REF and the internal addresses RADD and CADD when the second valid signal VCS2 is activated at a second valid command generation time.

The write latency shifting circuit 215 may be electrically connected to the clock division circuit 207 and the command address decoder 213 to receive the division clock IBCLK from the clock division circuit 207 and to receive the write command WR from the command address decoder 213. The write latency shifting circuit 215 may shift the write command WR, based on the division clock IBCLK to generate a shifting write command IWR.

The read latency shifting circuit 217 may be electrically connected to the clock division circuit 207 and the command address decoder 213 to receive the division clock IBCLK from the clock division circuit 207 and to receive the read command RD from the command address decoder 213. The read latency shifting circuit 217 may shift the read command RD, based on the division clock IBCLK to generate a shifting read command IRD.

In an embodiment, the semiconductor device 20 configured as described above may set the command generation time according to the chip selection signal CS without using a separate control signal, thereby minimizing the number of the control signals required to generate the command and increasing pad use efficiency. In addition, in an embodiment, the semiconductor device 20 may latch the command addresses CAx and CAy using the division clock IBCLK and perform the shifting operations necessary for the write and read operations, thereby stably performing the internal operations even when the high-frequency clocks CLK_T and CLK_C are input.

FIG. 4 is a timing diagram illustrating a command generation operation of the semiconductor device 20 shown in FIG. 3. The command generation operation of the semiconductor device 20 will be described in more detail with reference to FIGS. 3 and 4, as follows.

First, at time T21, the semiconductor device 20 in the power-down mode may receive the chip selection signal CS of a logic "high" level in synchronization with a rising edge of the clock CLK_T to exit from the power-down mode. Next, at time T22, after exiting from the power-down mode, the division enable signal generation circuit 205 may receive the chip selection signal CS of a logic "high" level to generate an activated division enable signal DIV_EN, and the clock division circuit 207 may generate the division clocks ICLK, QCLK, IBCLK, and QBCLK according to the division enable signal DIV_EN. Next, after time T23, the command address latch circuit 211 may sequentially latch the first command address CAx in synchronization with the division clocks ICLK, QCLK, IBCLK, and QBCLK to generate the first latch command addresses CA_R1<x>, CA_F1<x>, CA_R2<x>, and CA_F2<x>. Meanwhile, at the time T23, the detection condition of receiving the chip selection signal CS set to have a logic "high" level in synchronization with the rising edge of the division clock IBCLK is satisfied, so that the valid time determination circuit 209 may generate the first valid signal VCS1 that is activated at the first valid command generation time, that is, at time T25. During the section in which the first valid signal VCS1 is activated after the time T25, the command address decoder 213 may decode the first latch command addresses CA_R1<x>, CA_F1<x>, CA_R2<x>, and CA_F2<x> to generate at least one of the internal commands ACT, WR, RD, PRE, and REF and the internal addresses RADD and CADD. In addition, the valid time determination circuit 209 may generate the second valid signal VCS2 that is activated at the second valid command generation time, that is, time T26. During the section in which the second valid signal VCS2 is activated after the time T26, the command address decoder 213 may decode the first latch command addresses CA_R1<x>, CA_F1<x>, CA_R2<x>, and CA_F2<x> to generate at least one of the internal commands ACT, WR, RD, PRE, and REF and the internal addresses RADD and CADD.

Figure 5:
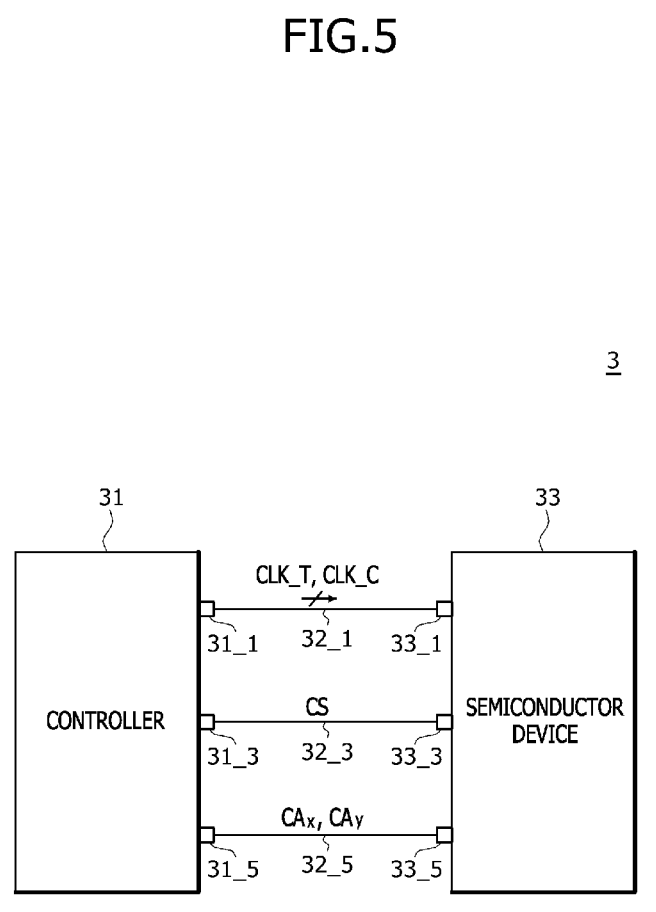

FIG. 5 is a block diagram illustrating a configuration of a semiconductor system 3 according to an embodiment of the present disclosure. As shown in FIG. 5, the semiconductor system 3 may include a controller 31 and a semiconductor device 33.

The controller 31 may include a first control pin 31_1, a second control pin 31_3, and a third control pin 31_5. The semiconductor device 33 may include a first device pin 33_1, a second device pin 333, and a third device pin 33_5. The controller 31 may transmit clocks CLK_T and CLK_C to the semiconductor device 33 through a first transmission line 32_1 connected between the first control pin 311 and the first device pin 331. The first control pin 31_1, the first transmission line 32_1, and the first device pin 33_1 may be provided for each of the clocks CLK_T and CLK_C. The controller 31 may apply a chip selection signal CS to the semiconductor device 33 through a second transmission line 32_3 connected between the second control pin 31_3 and the second device pin 333. The controller 31 may transmit a first command address CAx and a second command address CAy to the semiconductor device 33 through a third transmission line 32_5 connected between the third control pin 31_5 and the third device pin 33_5. The third control pin 315, the third transmission line 325, and the third device pin 33_5 may be provided for each of the first command address CAx and the second command address CAy.

The semiconductor device 33 may set the command generation time according to the chip selection signal CS without using a separate control signal, thereby minimizing the number of control signals required to generate the command and increasing pin use efficiency.

Figure 6:
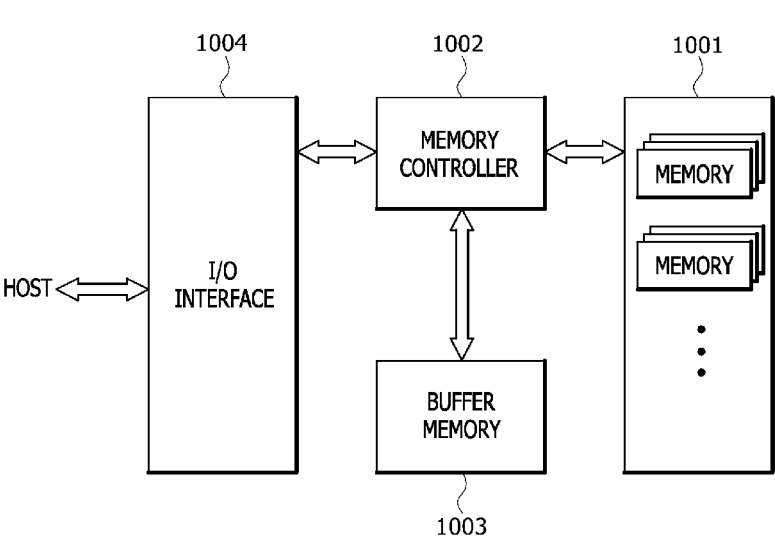
FIG. 6 is a block diagram illustrating a configuration of an electronic system according to an embodiment of the present disclosure.

The semiconductor device 10 previously described with reference to FIG. 1 and the semiconductor device 20 described with reference to FIG. 3 may be applied to electronic systems including memory systems, graphics systems, computing systems, mobile systems, and the like. For example, referring to FIG. 6, which is a block diagram illustrating a configuration of an electronic system 1000 according to an embodiment of the present disclosure, the electronic system 1000 may include a data storage unit 1001, a memory controller 1002, a buffer memory 1003, and an input/output interface 1004.

The data storage unit 1001 may store data (not shown) applied from the memory controller 1002 according to a control signal from the memory controller 1002, and may read out stored data (not shown) to output the data to the memory controller 1002. Meanwhile, the data storage unit 1001 may include non-volatile memory devices capable of continuously storing data without losing data even when power is cut off. The non-volatile memory device may include a flash memory device (NOR flash memory device, NAND flash memory device), a phase change random access memory (PRAM) device, a resistive random access memory (RRAM) device, a spin transfer torque random access memory (STTRAM) device, or a magnetic random access memory (MRAM) device.

The memory controller 1002 may decode instructions applied from an external device (host device) through the I/O interface 1004 and may control data input and output for the data storage 1001 and the buffer memory 1003 according to a decoding result. Although the memory controller 1002 is represented as one block in FIG. 6, a controller for controlling the data storage 1001 and a controller for controlling the buffer memory 1003 which is a volatile memory device may be configured independently in the memory controller 1002. The memory controller 1002 may include the controller 31 described above with reference to FIG. 5.

The buffer memory 1003 may store data to be processed by the memory controller 1002, that is, the data (not shown) input or output to or from the data storage unit 1001. The buffer memory 1003 may store the data (not shown) applied from the memory controller 1002 according to the control signal. The buffer memory 1003 may include the semiconductor device 10 described above with reference to FIG. 1 or the semiconductor device 20 described above with reference to FIG. 3. The buffer memory 1003 may read out stored data to output the data to the memory controller 1002. The buffer memory 1003 may include a volatile memory device such as a dynamic random access memory (DRAM) device, a mobile DRAM device, or a static random access memory (SRAM) device.

The I/O interface 1004 may provide physical connection between the memory controller 1002 and an external device (host device) to allow the memory controller 1002 to receive a control signal for data input/output from the external device and to exchange data with the external device. The I/O interface 1004 may include one of various interface protocols such as USB, MMC, PCI-E, SAS, SATA, PATA, SCSI, ESDI, and IDE.

The electronic system 1000 may be used as an auxiliary storage device of a host device or an external storage device. The electronic system 1000 may include a solid state disk (SSD), a universal serial bus (USB) memory, a secure digital (SD) card, a mini secure digital (mSD) card, a micro secure digital (micro SD) card, secure digital high capacity (SDHC), a memory stick card, a smart media (SM) card, a multimedia card (MMC), an embedded multimedia card (eMMC), a compact flash (CF) card, and the like.

Figure 7:
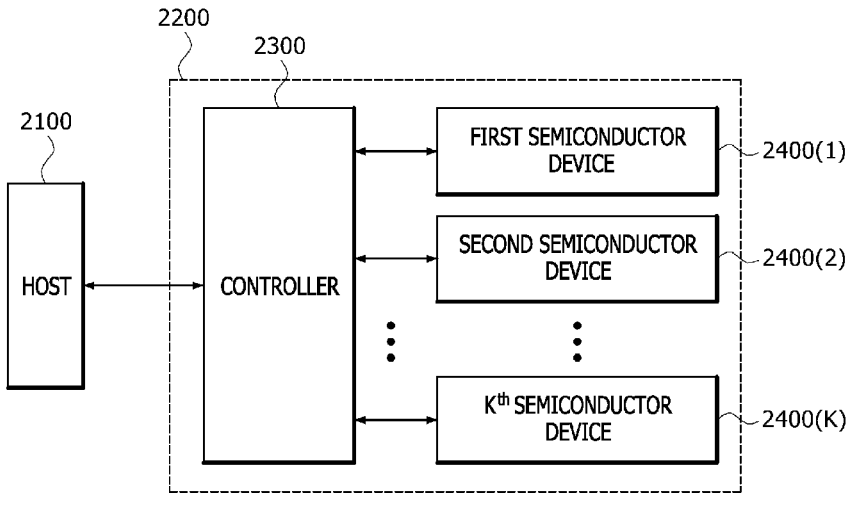
FIG. 7 is a block diagram illustrating a configuration of an electronic system according to another embodiment of the present disclosure.

FIG. 7 is a block diagram illustrating a configuration of an electronic system 2000 according to another embodiment of the present disclosure. As shown in FIG. 7, the electronic system 2000 may include a host 2100 and a semiconductor system 2200.

The host 2100 and the semiconductor system 2200 may transmit signals to each other using interface protocols. The interface protocols used between the host 2100 and the semiconductor system 2200 may include a multi-media card (MMC), an enhanced small disk interface (ESDI), integrated drive electronics (IDE), peripheral component interconnect-express (PCI-E), advanced technology attachment (ATA), serial ATA (SATA), parallel ATA (PATA), serial attached SCSI (SAS), universal serial bus (USB), and the like.

The semiconductor system 2200 may include a controller 2300 and semiconductor devices 2400(1:K). The controller 2300 may apply a voltage code V_CD, a code input control signal CICNT, and a fuse selection address FS_ADD to each of the semiconductor devices 2400(1:K). Each of the semiconductor devices 2400(1:K) may receive the voltage code V_CD, the code input control signal CICNT, and a fuse selection address FS_ADD to control a voltage level of an internal voltage VINT.

Each of the semiconductor devices 2400(1:K) may include the semiconductor device 10 described above with reference to FIG. 1 or the semiconductor device 20 described above with reference to FIG. 3. Each of the semiconductor devices 2400(1:K) may be implemented with one of a dynamic random access memory (DRAM) device, a phase change random access memory (PRAM) device, a resistive random access memory (RRAM) device, a magnetic random access memory (MRAM) device, and a ferro-electric random access memory (FRAM) device.

Concepts have been disclosed in conjunction with some embodiments as described above. Those skilled in the art will appreciate that various modifications, additions, and substitutions are possible, without departing from the scope and spirit of the present disclosure. Accordingly, the embodiments disclosed in the present specification should be considered not from a restrictive standpoint but rather from an illustrative standpoint. The scope of the concepts is not limited to the above descriptions but defined by the accompanying claims, and all of distinctive features in the equivalent scope should be construed as being included in the concepts.

What is claimed is:

1. A semiconductor device comprising:
a clock division circuit configured to receive a division enable signal to generate division clocks from a clock signal, when the division enable signal is activated based on a chip selection signal; and
a valid time determination circuit configured to be electrically connected to the clock division circuit to generate a valid signal for setting a generation time of a command, based on the chip selection signal and the division clocks,
wherein the valid time determination circuit is configured to detect a logic level of the chip selection signal in synchronization with one of the division clocks to generate the valid signal, and
wherein the valid time determination circuit is configured to generate the valid signal that is activated at a valid command generation time when a detection condition of receiving the chip selection signal set to have a preset logic level in synchronization, at least two times, with one of the division clocks is satisfied.

2. The semiconductor device of claim 1, wherein the clock division circuit is configured to generate the division clocks when the chip selection signal is received in a preset state and the division enable signal is activated after exiting from a power-down section.

3. The semiconductor device of claim 1, wherein the clock division circuit is configured to generate the division clocks when the chip selection signal set to have a preset logic level is received in synchronization with the clock signal and the division enable signal is activated after exiting from a power-down section.

4. The semiconductor device of claim 1, wherein the valid time determination circuit is configured to generate the valid signal that is activated at a valid command generation time when a detection condition of receiving the chip selection signal set to have a preset logic level in synchronization with one of the division clocks is satisfied.

5. The semiconductor device of claim 4, wherein the valid time determination circuit is configured to generate the valid signal that is activated at the valid command generation time set as a time when the detection condition is satisfied or when a preset delay section elapses from the time when the detection condition is satisfied.

6. The semiconductor device of claim 1, wherein the valid time determination circuit is configured to generate the valid signal that is activated at a valid command generation time when the detection condition of receiving the chip selection signal set to have a preset logic level in synchronization with one of the division clocks is satisfied.

7. The semiconductor device of claim 1, further comprising:

a command address latch circuit configured to latch a command address in synchronization with the division clocks to generate a latch command address; and
a command address decoder configured to decode the latch command address, based on the valid signal to generate internal commands and internal addresses.

8. The semiconductor device of claim 1, further comprising a latency shifting circuit configured to shift an internal command in synchronization with one of the division clocks to generate a shifting command.

9. A semiconductor device comprising:
a division enable signal generation circuit configured to generate a division enable signal that is activated when a chip selection signal set to have a preset logic level is received in synchronization with a clock signal after exiting from a power-down section; and
a valid time determination circuit configured to be electrically connected to the clock division circuit to generate a valid signal for setting a generation time of a command, based on division clocks generated based on the division enable signal and the chip selection signal,
wherein the valid time determination circuit is configured to generate the valid signal that is activated at a valid command generation time when a detection condition of receiving the chip selection signal set to have a preset logic level in synchronization, at least two times, with one of the division clocks is satisfied.

10. The semiconductor device of claim 9, wherein the valid time determination circuit is configured to generate the valid signal that is activated at a valid command generation time when a detection condition of receiving the chip selection signal set to have a preset logic level in synchronization with one of the division clocks is satisfied.

11. The semiconductor device of claim 10, wherein the valid time determination circuit is configured to generate the valid signal that is activated at the valid command generation time set as a time when the detection condition is satisfied or when a preset delay section elapses from the time when the detection condition is satisfied.

12. The semiconductor device of claim 9, wherein the valid time determination circuit is configured to generate the valid signal that is activated at a valid command generation time when the detection condition of receiving the chip selection signal set to have a preset logic level in synchronization with a rising edge and a falling edge of one of the division clocks is satisfied.

13. The semiconductor device of claim 9, further comprising:
a command address latch circuit configured to latch a command address in synchronization with the division clocks to generate a latch command address;
a command address decoder configured to decode the latch command address, based on the valid signal to generate internal commands and internal addresses; and
a latency shifting circuit configured to shift the internal command in synchronization with one of the division clocks to generate a shifting command.

14. A semiconductor device comprising:
a clock division circuit configured to receive a division enable signal to generate division clocks from a clock signal, when the division enable signal is activated based on a chip selection signal; and
a valid time determination circuit configured to be electrically connected to the clock division circuit to generate a first valid signal and a second valid signal for setting a generation time of a command, based on the chip selection signal and the division clocks, wherein the valid time determination circuit is configured to generate the first valid signal that is activated at a first valid command generation time and generate the second valid signal that is activated at a second valid command generation time when a detection condition of receiving the chip selection signal set to have a preset logic level in synchronization with one of the division clocks is satisfied, wherein the valid time determination circuit is configured to generate the second valid signal that is activated at the second valid command generation time set as a time after the first valid command generation time.

15. The semiconductor device of claim 14, wherein the valid time determination circuit is configured to generate the first valid signal that is activated at the first valid command generation time set as a time when the detection condition is satisfied or when a preset delay section elapses from the time when the detection condition is satisfied.

16. The semiconductor device of claim 14, wherein the valid time determination circuit is configured to generate the first valid signal that is activated at a first valid command generation time and generate the second valid signal that is activated at a second valid command generation time when a detection condition of receiving the chip selection signal set to have a preset logic level in synchronization, at least two times, with one of the divided clocks is satisfied.

* * * * *